United States Patent
Yamada

(10) Patent No.: US 9,523,569 B2
(45) Date of Patent: Dec. 20, 2016

(54) POSITIONING APPARATUS, LITHOGRAPHY APPARATUS, AND ARTICLE MANUFACTURING METHOD

(71) Applicant: CANON KABUSHIKI KAISHA, Tokyo (JP)

(72) Inventor: Masanori Yamada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/552,427

(22) Filed: Nov. 24, 2014

(65) Prior Publication Data

US 2015/0153655 A1  Jun. 4, 2015

(30) Foreign Application Priority Data

Nov. 29, 2013  (JP) .................. 2013-247124

(51) Int. Cl.

| | |
|---|---|
| G03B 27/42 | (2006.01) |
| G03B 27/58 | (2006.01) |
| G01B 11/14 | (2006.01) |
| G03F 7/20 | (2006.01) |
| G01B 9/02 | (2006.01) |

(52) U.S. Cl.
CPC ........... *G01B 11/14* (2013.01); *G01B 9/02027* (2013.01); *G03F 7/70725* (2013.01); *G03F 7/70775* (2013.01)

(58) Field of Classification Search
CPC .................................................. G03F 7/70725
USPC ....................................................... 355/53, 72
See application file for complete search history.

(56) References Cited

U.S. PATENT DOCUMENTS

| | | | |
|---|---|---|---|
| 7,411,678 B2* | 8/2008 | Kurosawa | G03F 7/70725 356/399 |
| 2003/0165265 A1 | 9/2003 | Kurosawa | |
| 2008/0094593 A1* | 4/2008 | Shibazaki | G03F 7/70725 355/53 |
| 2009/0033900 A1* | 2/2009 | Kanaya | G03F 7/70775 355/53 |

FOREIGN PATENT DOCUMENTS

| | | |
|---|---|---|
| CN | 101356623 A | 1/2009 |
| CN | 101385122 A | 3/2009 |
| CN | 102360169 A | 2/2012 |
| JP | 2002-319541 A | 10/2002 |
| JP | 2003-254739 A | 9/2003 |
| JP | 2006-222312 A | 8/2006 |

* cited by examiner

*Primary Examiner* — Hung Henry Nguyen
(74) *Attorney, Agent, or Firm* — Canon U.S.A., Inc. IP Division

(57) ABSTRACT

An apparatus, includes first and second measurement devices configured to measure a position in a first direction of a moving body; a drive unit configured to drive the moving body in the first direction; a controller configured to generate a control input for driving the drive unit, based on a control deviation in accordance with position command information in the first direction of the moving body and position measurement information from the first or second measurement device, and a control parameter set to a certain value.

19 Claims, 8 Drawing Sheets

POSITIONING APPARATUS, LITHOGRAPHY APPARATUS, AND ARTICLE MANUFACTURING METHOD

BACKGROUND OF THE INVENTION

Field of the Invention

The present invention relates to a positioning apparatus that positions a moving body by using a plurality of position measurement devices being switched with one another, and to a lithography apparatus or an article manufacturing method using such a positioning apparatus.

Description of the Related Art

A lithography apparatus for manufacturing semiconductor devices, liquid crystal devices, or the like includes a positioning apparatus that positions a stage on which a substrate or an original are mounted.

Japanese Patent Laid-Open No. 2002-319541 describes the use of an interferometer as a position measurement device for measuring the position in a Z-axis direction (a direction along the optical axis of an optical projecting system) of a stage. Measurement light from the interferometer that progresses along the Z-axis direction is reflected at a mirror located on an upper surface of the stage. The interferometer measures the position on the basis of an interference pattern generated by interference between the reflected light and reference light.

In addition, Japanese Patent Laid-Open No. 2002-319541 describes the use of a plurality of interferometers and a plurality of mirrors that are switched with one another in accordance with the position in an XY direction of the stage. As described above, by using the plurality of interferometers and the plurality of mirrors which are switched with one another, even in the case where measurement light from one interferometer is blocked by the optical projecting system, the position of the stage can still be measured by using measurement light from another interferometer.

The position in the Z-axis direction of the stage, detected by the interferometer(s), is used in position feedback control of the stage. However, Japanese Patent Laid-Open No. 2002-319541 describes no details about feedback control of the position in the Z-axis direction.

SUMMARY OF THE INVENTION

An aspect of the present invention provides an apparatus that positions a moving body. The apparatus includes first and second measurement devices, a drive unit, a controller, a switch unit, and a change unit. The first and second measurement devices are configured to measure a position in a first direction of the moving body. The drive unit is configured to drive the moving body in the first direction. The controller is configured to generate a control input for driving the drive unit, based on a control deviation in accordance with position command information in the first direction of the moving body and position measurement information from the first or second measurement device, and a control parameter set to a certain value. The switch unit is configured to switch a measurement device used in generation of the control input from the first measurement device to the second measurement device or from the second measurement device to the first measurement device. The change unit is configured to change the set value of the control parameter in accordance with switching performed by the switch unit.

Further features of the present invention will become apparent from the following description of exemplary embodiments with reference to the attached drawings.

DESCRIPTION OF THE EMBODIMENTS

Figure 1:
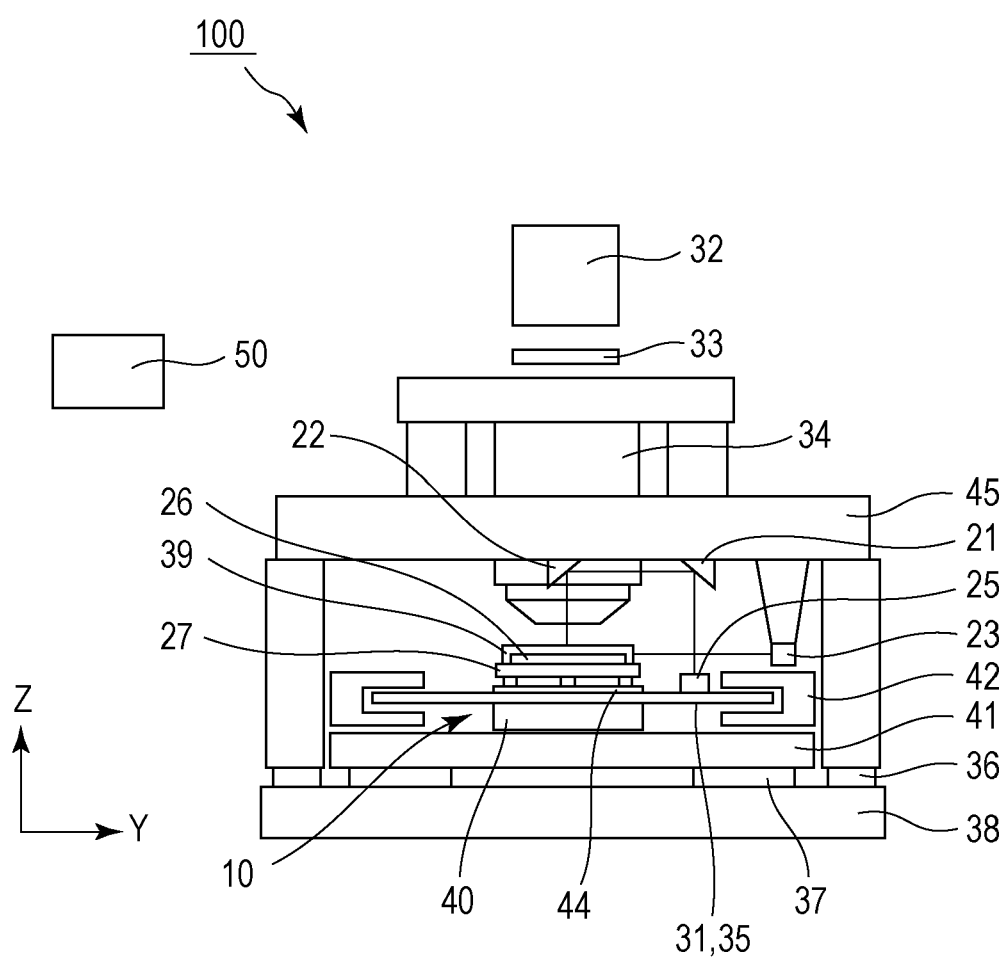
FIG. 1 is a schematic diagram illustrating the configuration of a semiconductor exposure apparatus.
Figure 2:
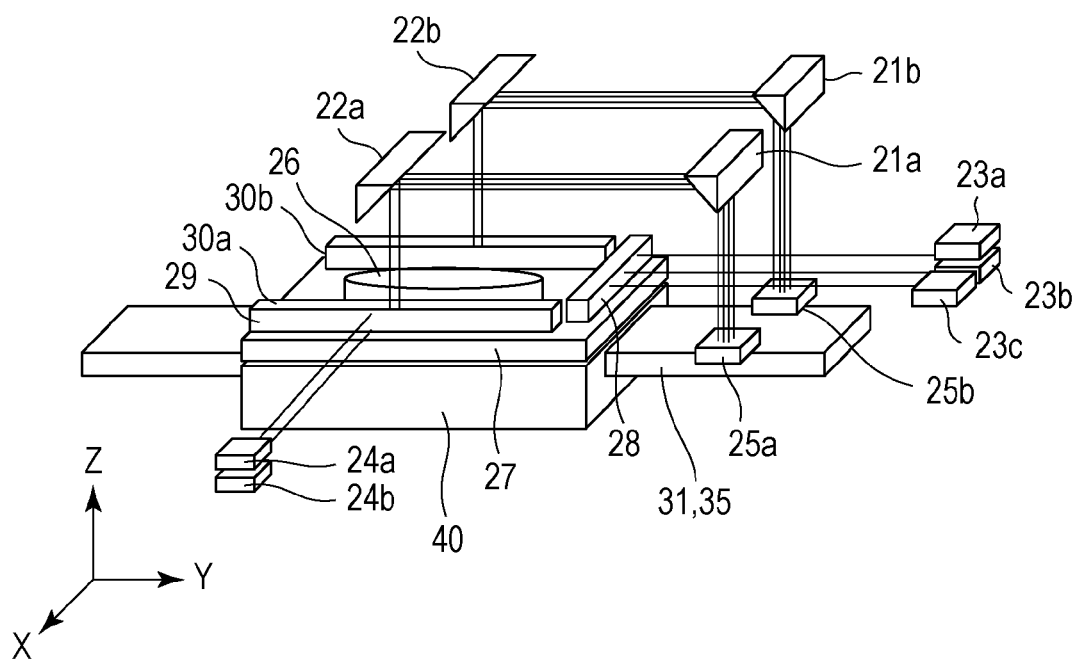
FIG. 2 is a perspective view illustrating the configuration of a periphery of a wafer stage.

FIG. 1 is a diagram illustrating a semiconductor exposure apparatus 100. FIG. 2 is a perspective view illustrating a periphery of a wafer stage 10 illustrated in FIG. 1. In an embodiment, the semiconductor exposure apparatus 100 is described as a step-and-scan exposure apparatus.

A reticle (original) on which a pattern to be transferred is formed, and a wafer (substrate) coated with a photoresist material are carried into the semiconductor exposure apparatus 100. An illumination system 32 illuminates the reticle (not illustrated) mounted on a reticle stage 33 with slit light, and a projection system 34 projects a pattern image of the reticle on the wafer (not illustrated) mounted on the wafer stage 10 (positioning apparatus). By moving the reticle stage 33 and the wafer stage 10 in synchronization with a scanning direction (Y-axis direction), the pattern on the reticle is transferred onto the wafer coated with the photoresist material. In the embodiment, the illumination system 32 and the projection system 34 constitute a patterning unit configured to form a pattern on a wafer (including a latent image on a photoresist material).

The wafer stage 10 includes an X stage 31 movable with long strokes in an X-axis direction with respect to a surface plate 41, and a Y stage 40 movable with long strokes in the Y-axis direction with respect to the X stage 31. The wafer stage 10 further includes a top stage (moving body) 27 movable with short strokes in the X-axis direction, Y-axis direction, Z-axis direction (the optical axis direction of the projection system 34), ωx direction, ωy direction, and ωz direction (hereinafter referred to as "six-axis directions") with respect to the Y stage 40.

Here, the ωx direction indicates the direction of rotation around the X-axis, the ωy direction indicates the direction of rotation around the Y-axis, and the ωz direction indicates the direction of rotation around the Z-axis. A wafer chuck (holding unit) 26 that holds the wafer is mounted on the top stage 27.

The X stage 31 is driven by an X linear motor 42. The X linear motor 42 includes a plurality of coils (stators) arranged on the surface plate 41, and a permanent magnet (movable element) provided on the X stage 31. The Y stage 40 is driven by a Y linear motor 35. The Y linear motor 35 includes a plurality of coils (stators) arranged on the X stage 31, and a permanent magnet (movable element) provided on the Y stage 40. A bearing is configured between the X stage 31 and the Y stage 40. With the driving by the X linear motor 42, the X stage 31 and the Y stage 40 integrally move in the X-axis direction. The Y stage 40 and the X stage 31 are supported via a gas bearing on the surface plate 41.

The top stage 27 is driven in the six-axis directions by a plurality of linear motors. In the embodiment, two X linear motors for the X-axis direction, one Y linear motor for the Y-axis direction, and three Z linear motors 44 (drive unit) for the Z-axis direction are provided (FIG. 1 only illustrates one Z linear motor 44). Each linear motor includes a coil (stator) arranged on the Y stage 40 and a permanent magnet (movable element) provided on the top stage 27. In addition, the top stage 27 is supported by a self-weight support mechanism (not illustrated) while floating over the Y stage 40.

The projection system 34 includes a plurality of optical elements, and a barrel accommodating the plurality of optical elements. The projection system 34 is supported by a barrel support body 45. The barrel support body 45 is supported on a base member 38 via an air mount 36. The surface plate 41 is supported on the base member 38 via an air mount 37. The air mounts 36 and 37 are, for example, conventional active anti-vibration apparatuses. Such active anti-vibration apparatuses reduce vibration transmitted from the floor through the base member 38, and, with a built-in actuator and sensor, suppresses vibration generated by movement of an object on the barrel support body 45 or the surface plate 41.

In addition, the wafer stage 10 includes interferometers (position measurement devices) for measuring the position of the top stage 27. X interferometers 24a and 24b emit measurement light to a mirror 29 on the top stage 27, and measures (detects) the position in the X-axis direction of the top stage 27 from an interference pattern generated by interference between reflected light and reference light. Y interferometers 23a, 23b, and 23c emit measurement light to a mirror 28 on the top stage 27, and measures (detects) the position in the Y-axis direction of the top stage 27 from an interference pattern generated by interference between reflected light and reference light. In addition, the position in the ωy direction of the top stage 27 is measured by using a difference between the measurement values of the X interferometers 24a and 24b, and the position in the ωx direction of the top stage 27 is measured by using a difference between the measurement values of the Y interferometers 23a and 23b. Further, the position in the ωz direction of the top stage 27 is measured by using a difference between the measurement values of the Y interferometers 23b and 23c.

Z interferometers 25a and 25b emit measurement light to mirrors 30a and 30b on the top stage 27, and measures (detects) the position in the Z-axis direction of the top stage 27 from an interference pattern generated by interference between reflected light and reference light. Measurement light from the Z interferometer 25a is emitted to the mirror 30a via mirrors 21a and 22a fixed to the barrel support body 45, and measurement light reflected from the mirror 30a is guided to the interferometer 25a via the mirrors 21a and 22a. Similarly, measurement light from the Z interferometer 25b is emitted to the mirror 30b via mirrors 21b and 22b fixed to the barrel support body 45, and measurement light reflected from the mirror 30b is guided to the interferometer 25b via the mirrors 21b and 22b. In addition, reference light from the interferometer 25a is emitted to the mirror 22a via the mirror 21a, and the reference light reflected from the mirror 22a is guided to the interferometer 25a via the mirror 21a. Similarly, reference light from the interferometer 25b is emitted to the mirror 22b via the mirror 21b, and the reference light reflected from the mirror 22b is guided to the interferometer 25b via the mirror 21b.

The mirrors 30a and 30b have long shapes along the Y-axis direction. The mirrors 21a, 21b, 22a, and 22b have long shapes along the X-axis direction. The Z interferometers 25a and 25b are arranged on the X stage 31. With such a configuration, regardless of the position in the XY direction of the top stage 27, measurement light can be emitted to the mirror 30a or the mirror 30b. The projection system 34 is arranged between the mirrors 22a and 22b. In the case where the projection system 34 is positioned above one of the mirrors 30a and 30b, the position can be measured by using the other mirror. Note that, instead of providing the Z interferometers 25a and 25b on the X stage 31, mirrors or prisms may be provided, and measurement light and reference light from the Z interferometers 25a and 25b arranged outside may be guided by these optical elements to the mirrors 21a and 22a.

Position sensors (not illustrated) are provided between the top stage 27 and the Y stage 40. In the embodiment, linear encoders are used as the position sensors. With linear encoders provided at three places, the position in the Z-axis direction, ωx direction, and ωy direction of the top stage 27 with respect to the Y stage 40 can be measured. The linear encoders are used in measurement of the surface shapes of the mirrors 30a and 30b, and calibration for correction thereof. Instead of the linear encoders, capacitance sensors or the like may be used.

Figure 3:
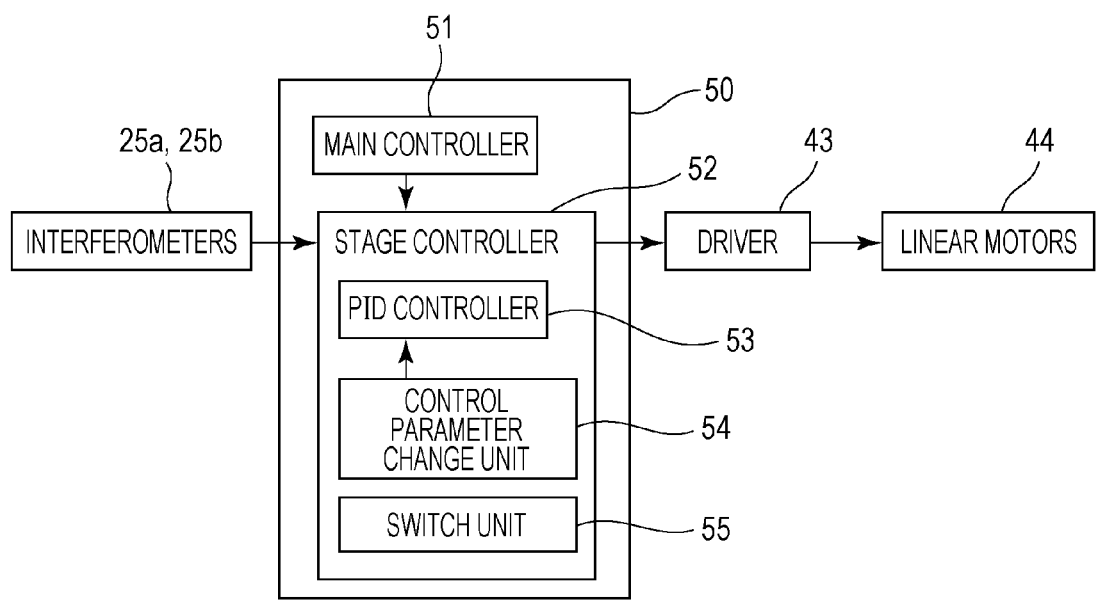
FIG. 3 is a diagram illustrating a controller of the semiconductor exposure apparatus.

The semiconductor exposure apparatus 100 includes a controller 50 including a central processing unit (CPU), a memory, and the like. FIG. 3 is a diagram illustrating the details of the controller 50. In the following description, control of the position in the Z-axis direction of the top stage 27 will be described.

The controller 50 includes a main controller 51 and a stage controller 52. The main controller 51 controls the overall sequence of the semiconductor exposure apparatus 100, and transmits position command information to the stage controller 52. Instead of transmitting position command information, the main controller 51 may transmit information used for generating position command information, and the stage controller 52 may generate position command information. In addition, the semiconductor exposure apparatus 100 includes a focus detector that detects the position in the Z-axis direction of the surface of the substrate. Position command information $Z_r$ may be obtained from the focus detector, instead of the main controller 51.

The stage controller (controller) 52 includes a proportional-integral-derivative (PID) controller 53, a control parameter change unit (change unit) 54, and a switch unit (switch unit) 55. The stage controller 52 obtains position command information from the main controller 51, obtains position measurement information of the top stage 27 from the interferometer 25a or 25b, and, on the basis of the obtained position command information and position measurement information, performs feedback control of the position of the top stage 27.

Figure 4:
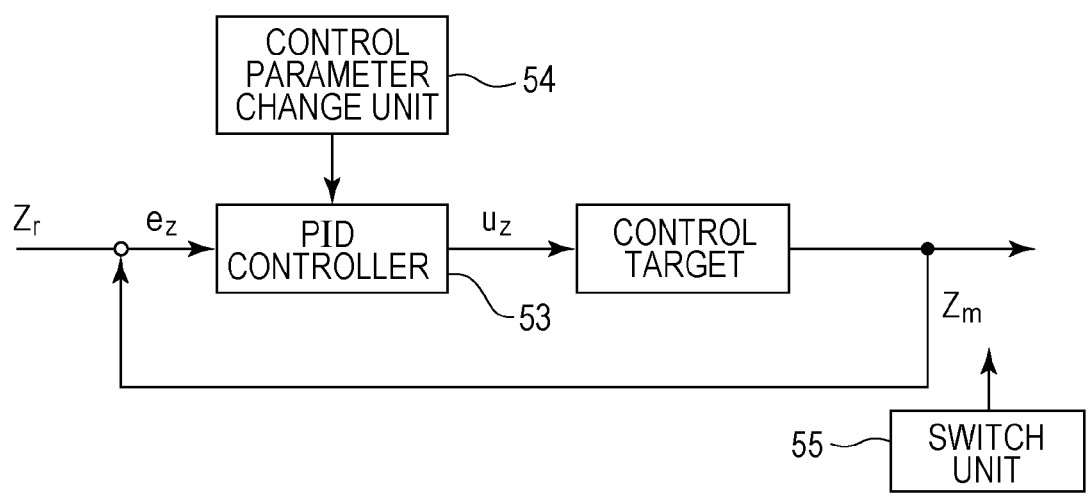
FIG. 4 is a diagram illustrating a control block of position control.

FIG. 4 is a control block diagram illustrating the position control of the top stage 27. Position measurement information $Z_m$ from the interferometer 25a or 25b is given as a feedback to position command information $Z_r$, and a control deviation $e_z$ is input to the PID controller 54. On the basis of a control parameter set to a certain value and the control deviation $e_z$, the PID controller 53 generates a control input $u_z$ for driving the linear motors 44. A control target includes a driver 43, the linear motors 44, and the top stage 27, and the control input is input to the driver 43. In the embodiment, the control parameter indicates the sensitivity of the control input $u_z$ with respect to the control deviation $e_z$, and is any of a proportional gain Kp, an integral gain Ki, and a derivative gain Kd, or a combination of at least two thereof. Note that, for position control in a direction other than the Zaxis direction, the same or similar feedback control is performed, except for the point that there is no switching of the interferometer.

The switch unit 55 switches the interferometer used in generation of the control input $u_z$ from the interferometer 25a to the interferometer 25b or from the interferometer 25b to the interferometer 25a.

For example, in the case where the projection system 34 is positioned above the mirror 30a, measurement light from the interferometer 25a is blocked by the projection system 34, and measurement may not be performed. Thus, the switch unit 55 switches the interferometer used in generation of a control command, on the basis of position information in the X-axis direction (or XY direction) of the top stage 27. Position information in the X-axis direction of the top stage 27 may be position measurement information obtained either from the interferometer 24a or 24b, or may be position command information obtained from the main controller 51. In addition, information used for switching may be information for specifying a shot area, or any information as long as it is correlated with the position in the X-axis direction of the top stage 27.

Switching of the interferometer is performed when the top stage 27 is positioned at a position at which measurement can be performed simultaneously by the interferometers 25a and 25b, by transferring the measurement value of one interferometer used prior to the switching to the other interferometer used after the switching.

The control parameter change unit 54 changes the control parameter set in the PID controller 53. In the embodiment, two values are stored in advance in a memory (storage unit), and the two values that are switched with each other serve as set values (a first set value and a second set value) of the PID controller 53, thereby changing the control parameter. The control parameter is changed in accordance with switching of the interferometer. In this specification, the expression "in accordance with switching" is not limited to the case in which the control parameter is changed after switching of the interferometer, and used in the sense including the case in which the control parameter is changed prior to switching of the interferometer. By changing the control parameter, even in the case where control characteristics of a feedback control system change due to switching of the interferometer, high control performance can be achieved. That is, the positioning apparatus can have high positioning precision. In addition, in a configuration, as in the embodiment, in which the mirrors to be used are also switched along with switching of the interferometer, the control characteristics change greatly due to the switching. Thus, improvement in positioning precision according to the embodiment of the present invention is effective.

Figure 5:
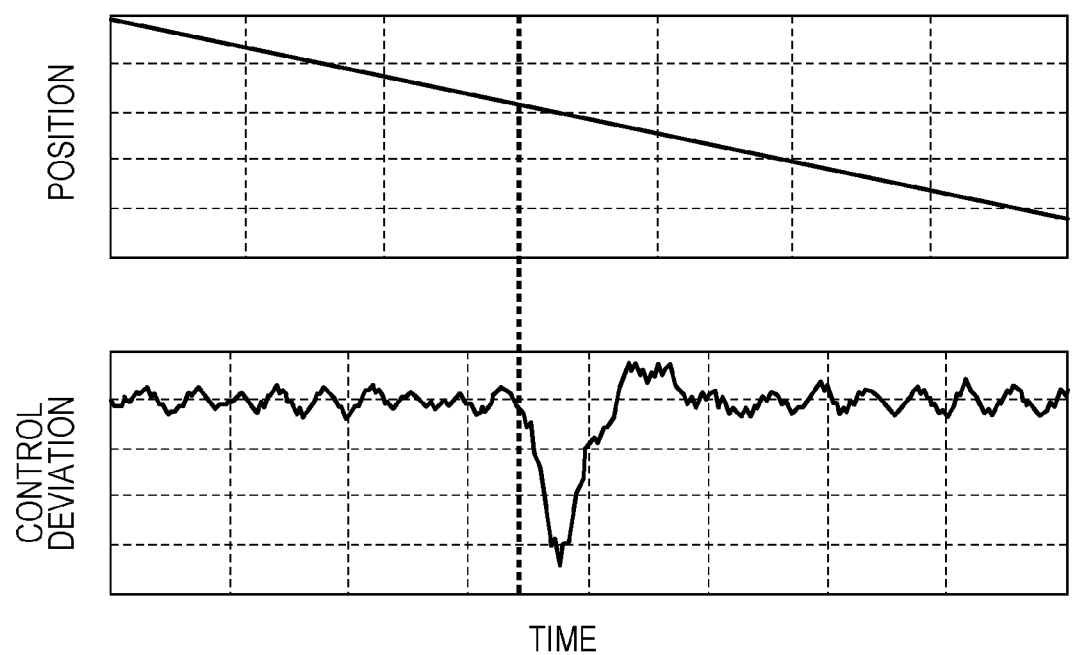
FIG. 5 is a diagram illustrating a control deviation generated by switching of a control parameter.

Next, the timing to change the control parameter will be described. FIG. 5 is a diagram illustrating a control deviation in the case where the control parameter is changed. In FIG. 5, time is plotted in abscissa, position command information in the X-axis direction is plotted in ordinate (upper diagram), and a control deviation in the Z-axis direction is plotted in ordinate (lower diagram). As is clear from FIG. 5, the control deviation becomes great immediately after the control parameter is changed, and, due to the feedback control, converges to be within a certain range after time $T_1$.

In the embodiment, the timing to change the control parameter is determined so as to reduce an influence of an increase in the control deviation on positioning precision during exposure (while exposure light is emitted to the substrate).

Figure 6:
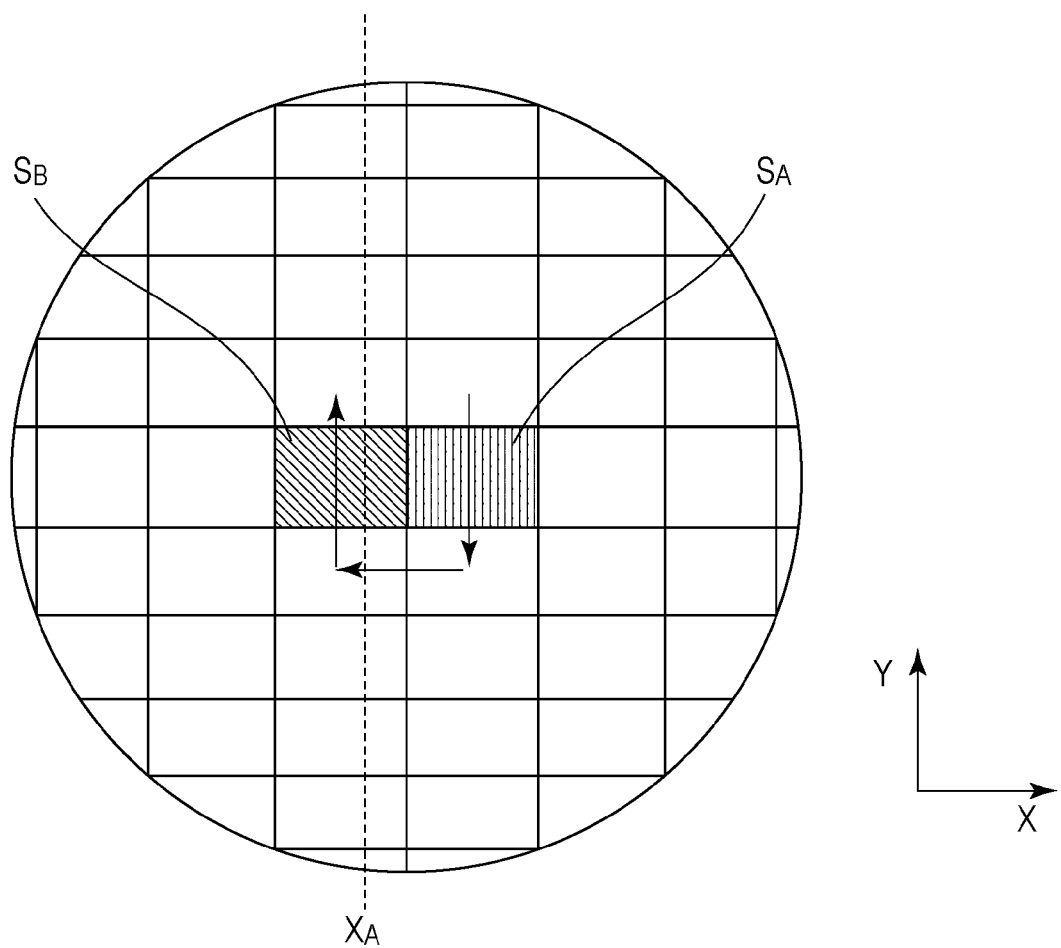
FIG. 6 is a diagram illustrating a plurality of shot areas on a wafer.
Figure 7:
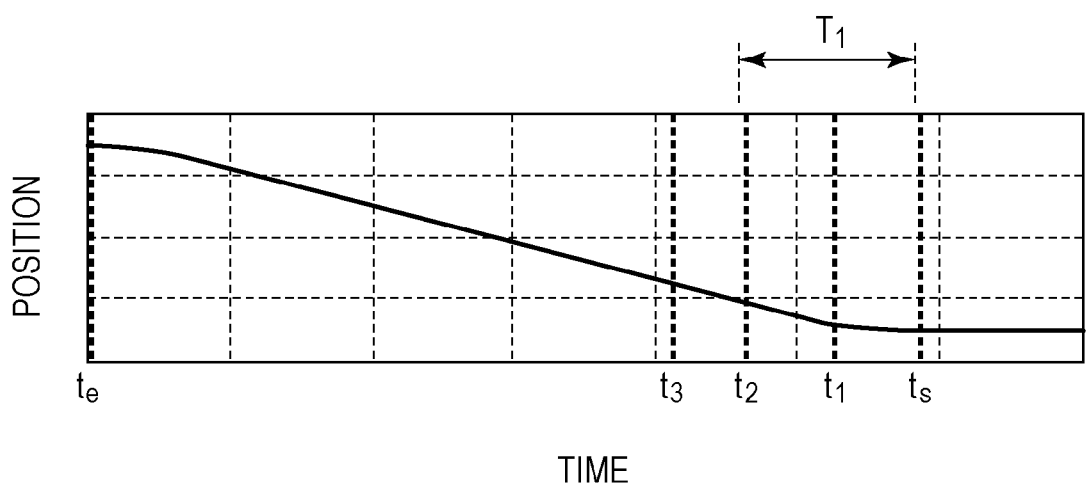
FIG. 7 is a diagram illustrating a control parameter changing timing.

FIG. 6 is a diagram illustrating a plurality of shot areas (processed areas exposed in one scan) on the wafer. FIG. 7 is a diagram illustrating the timing to change the control parameter in the embodiment. In FIG. 7, time is plotted in abscissa, and the position in the X-axis direction of the top stage 27 is plotted in ordinate. As is indicated by arrows in FIG. 6, the case in which a shot area $S_A$ is scanned with slit light in the Y-axis direction (negative direction), and then a shot area $S_B$ is scanned with slit light in the Y-axis direction (positive direction) will be described. Between exposure of the shot area $S_A$ and the shot area $S_B$, step movement in the X-axis direction is performed. Scanning with slit light and step movement are performed by driving of the wafer stage 10.

In the case where switching of the interferometer occurs at a position $X_A$ in the middle of step movement, if the control parameter is changed at the same time, the control deviation may not become sufficiently small at the start of exposure (second process) of the shot area $S_B$. Therefore, in the embodiment, the control parameter is changed at a timing t3 that is earlier than an exposure start time $t_s$ by time $T_1$ or greater (prior to a timing t2 that is earlier than the exposure start time $t_s$ by time $T_1$). That is, the control parameter change unit 54 obtains information regarding (correlated with) the timing of the exposure start of the shot area $S_B$, and, on the basis of this information, changes the control parameter.

In addition, since an influence on positioning precision may be reduced during exposure of the shot area $S_A$, the parameter is changed after an exposure (first process) end time $t_e$ of the shot area $S_A$. That is, the control parameter change unit 54 obtains information regarding (correlated with) the timing of the exposure end of the shot area $S_A$, and, on the basis of this information, changes the control parameter.

For example, the control parameter may be changed along with the start of step movement. Since a time for step movement may be longer than a time for the control deviation to become sufficiently small, it becomes possible to reduce an influence on positioning precision during exposure of both the shot area $S_A$ and the shot area $S_B$. In this case, information regarding the timing of the exposure start, which is described above, becomes a start signal for step movement toward the shot area $S_B$. As information regarding the timing, time information, shot area information, or information regarding the position of the moving body may be used.

Although the interferometers are used as examples of position measurement devices in the above-described embodiment, the embodiment is not limited to this case, and other position measurement devices may be used. In addition, although the linear motors are used as drive units, the embodiment is not limited to this case, and other drive units (for example, piezoelectric element) may be used. In addition, the controller, the switch unit, and the change unit may be configured with a single circuit substrate including a CPU (processor), a memory, and a read-only memory (ROM), or may be configured with a plurality of circuit substrates.

In addition, although the proportional gain Kp, integral gain Ki, and derivative gain Kd of PID control are given as examples of control parameters, the control parameter to be changed may be the frequency of a notch filter or the cutoff frequency of a low-pass filter. In addition, although the example in which the interferometer for the Z-axis direction is switched has been described, the embodiment is applicable to the case in which the interferometer for the Y-axis direction or X-axis direction is switched.

Although the positioning apparatus used in the step-and-scan semiconductor exposure apparatus has been described as an example in the above-described embodiment, the embodiment is not limited to this case. The embodiment is applicable to a lithography apparatus such as a step-and-repeat semiconductor exposure apparatus, an imprint apparatus, or a maskless charged-particle beam rendering apparatus. In this case, the patterning unit is configured different for each apparatus. In addition, the embodiment is also applicable to an apparatus that requires high positioning precision (such as a microscope or a processing apparatus), besides lithography apparatuses.

Figure 8:
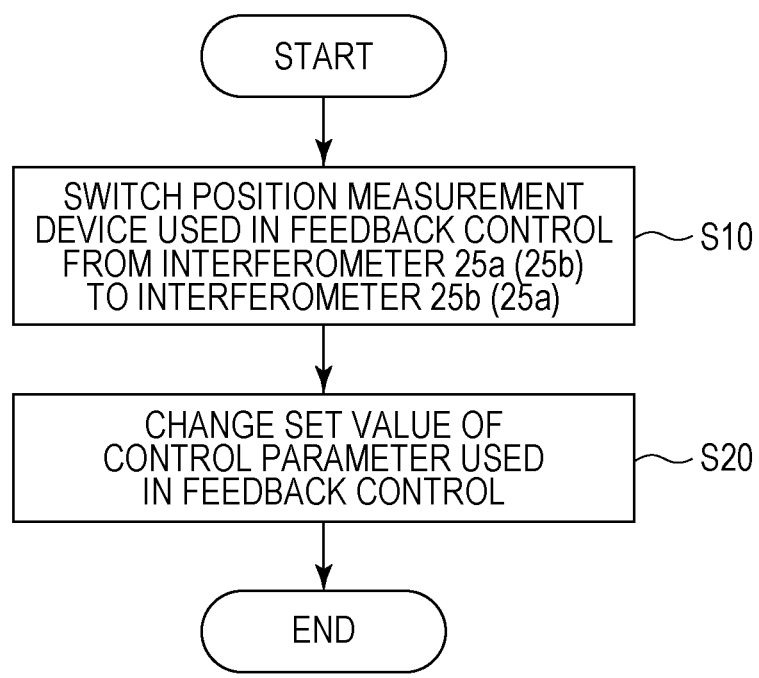
FIG. 8 is a diagram describing the flow of a positioning method.

FIG. 8 is a diagram describing the flow of the above-described positioning method (a portion related to changing the control parameter is extracted). The positioning method of the embodiment measures the position in the Z-axis direction of the top stage 27, performs feedback control based on information regarding the measured position, and positions the top stage 27. The positioning method includes the step (S10) of switching the position measurement device used in feedback control from the interferometer 25a (25b) to the interferometer 25b (25a), and the step (S20) of changing the set value of the control parameter used in feedback control. A program stored in the memory of the above-described controller 50 may cause a computer to execute processing in these steps.

[Article Manufacturing Method]

Next, an article manufacturing method using a lithography apparatus will be described. In this specification, the term "article" refers to those that can be formed by lithographic patterning, such as a semiconductor device, a liquid crystal display device, a reticle (mask) used in manufacturing these devices, or a fine structure body.

For example, a semiconductor device will be described. A semiconductor device is manufactured by going through a front-end process (wafer processing) of making an integrated circuit on a wafer, and a back-end process of completing the integrated circuit chip on the wafer, made in the front-end process, as a product. The front-end process includes the step of exposing a wafer coated with a photoresist material by using the above-described semiconductor exposure apparatus 100, and the step of developing and etching the wafer. Instead of the etching step, a doping step may be performed. After the development, there are several processing modes. The back-end process includes an assembly step (dicing and bonding), and a packaging step (chip encapsulation). A liquid crystal display device is manufactured by going through the step of forming a transparent electrode. The step of forming a transparent electrode includes the step of coating a glass substrate, on which a transparent conductive film is deposited, with a photoresist material, the step of exposing the glass substrate, coated with the photoresist material, by using the above-described exposure apparatus 100, and the step of developing the glass substrate. According to the device manufacturing method of the embodiment, devices with higher quality than those manufactured with conventional methods can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-247124, filed Nov. 29, 2013, which is hereby incorporated by reference herein in its entirety.

What is claimed is:

1. An apparatus for positioning a moving body, the apparatus comprising:
   a first measurement device and a second measurement devices respectively configured to obtain position measure information in a first direction of the moving body;
   a drive unit configured to drive the moving body in the first direction; and
   a controller configured to control the drive unit based on the position measurement information obtained by the first measurement device or the second measurement device,
   wherein the controller is configured to control the drive unit based on a control deviation in accordance with position command information in the first direction of the moving body and the position measurement information, and a control parameter set to a certain value, and
   wherein the value of the control parameter being set differs according to whether the position measurement information is the information obtained by the first measurement device or the information obtained by the second measurement device.

2. The apparatus according to claim 1, wherein the control parameter is at least one of a proportional gain Kp, an integral gain Ki, a derivative gain Kd, frequency of a notch filter, and cutoff frequency of a low-pass filter.

3. The apparatus according to claim 1, wherein the controller includes the PID control unit.

4. The apparatus according to claim 1,
   wherein the first measurement device and the second measurement device are provided to different positions with respect to a second direction that is perpendicular to the first direction of the moving body.

5. The apparatus according to claim 1,
   wherein the wherein the driving unit drives the moving body from a first position for performing a first process on a substrate mounted on the moving body to a second position for performing a second process on the substrate when performing a step movement of the moving body in the second direction, and
   wherein, the controller switches the position measurement information and the set value of the control parameter during the step movement.

6. The apparatus according to claim 5,
   wherein the apparatus performs a first process on a substrate mounted on the moving body, causes the moving body to perform step movement in the second direction, and performs a second process on the substrate, and
   wherein the controller switches the set value of the control parameter at a timing earlier than the start of the second process by a certain time.

7. A lithography apparatus comprising:
   a positioning apparatus configured to position a moving body; and
   a patterning unit configured to form a pattern on the substrate mounted on the moving body,
   wherein the positioning apparatus comprising:

a first measurement device and a second measurement device respectively configured to obtain position measure information in a first direction of the moving body;
a drive unit configured to drive the moving body in the first direction; and
a controller configured to control the drive unit based on the position measurement information obtained by the first measurement device or the second measurement device,
wherein the controller is configured to control the drive unit based on a control deviation in accordance with position command information in the first direction of the moving body and the position measurement information, and a control parameter set to a certain value, and
wherein the value of the control parameter being set differs according to whether the position measurement information is the information obtained by the first measurement device or the information obtained by the second measurement device.

8. An article manufacturing method comprising:
forming a pattern on the substrate by using the lithography apparatus according to claim 7; and
processing the substrate, on which the pattern is formed.

9. A controlling method performing in an apparatus for positioning a moving body, comprising a first measurement device and a second measurement device respectively configured to obtain position measure information of the moving body in a first direction, a drive unit capable of driving the moving body in the first direction, and a controller configured to control the drive unit based on the position measurement information representing a position of the moving body in the first direction obtained by the first measurement device or the second measurement device, the method comprising:
generating a control input for driving the drive unit based on a control deviation in accordance with position command information in the first direction of the moving body and the position measurement information, and a control parameter set to a certain value; and
controlling the drive unit based on the control input being generated, wherein, in a case where the position measurement information is obtained by the first measurement device, a first value is used for the control parameter, and in a case where the position measurement information is obtained by the second measurement device, a second value that is different from the first value is used for the control parameter.

10. The apparatus according to claim 4,
wherein, based on the information regarding the position of the moving body with respect to the second direction, the controller is configured to switch the position measurement information used for driving the drive unit from position measurement information obtained by the first measurement device to position measurement information obtained by the second measurement device.

11. The apparatus according to claim 1,
wherein the controller is configured to switch the set value of the control parameter in accordance with the switching of the position measurement information used for driving the drive unit.

12. The apparatus according to claim 6, wherein the controller switches the set value of the control parameter after finishing the first process.

13. The apparatus according to claim 1, wherein both the first measurement device and the second measurement device are interferometers.

14. The apparatus according to claim 7,
wherein the lithography apparatus is any one of a step-and-scan exposure apparatus, a step-and-repeat exposure apparatus, imprint apparatus, or a charged-particle beam rendering apparatus.

15. The controlling method according to claim 9, wherein the control parameter is at least one of a proportional gain Kp, an integral gain Ki, a derivative gain Kd, frequency of a notch filter, and cutoff frequency of a low-pass filter.

16. The method according to the claim 9, wherein the step of controlling is performed in PID control.

17. The controlling method according to claim 9,
wherein the first measurement device and the second measurement device are provided to different positions with each other with respect to a second direction perpendicular to the first direction of the moving body, and
wherein, before the generating, the position measurement information used for generating the control input is switched from the information obtained by the first measurement device to the information obtained by the second measurement device based on the position information of the moving body with respect to the second direction.

18. The controlling method according to claim 9,
wherein the first measurement device and the second measurement device are provided to different positions with each other with respect to the second direction perpendicular to the first direction of the moving body, and
wherein, before the generating, the position measurement information used for generating the control input is switched from the information obtained by the first measurement device to the information obtained by the second measurement device based on the position information of the moving body with respect to the second direction.

19. The controlling method according to claim 9, wherein the set value of the control parameter is switched according to the switch of position information used for generating the control input.

* * * * *